(12) United States Patent
Scheucher

(10) Patent No.: US 7,508,051 B2
(45) Date of Patent: Mar. 24, 2009

(54) WAFER WITH OPTICAL CONTROL MODULES IN DICING PATHS

(75) Inventor: Heimo Scheucher, Langegg (AT)

(73) Assignee: NXP B.V., Eindhoven (NL)

( * ) Notice: Subject to any disclaimer, the term of this patent is extended or adjusted under 35 U.S.C. 154(b) by 319 days.

(21) Appl. No.: 10/584,102

(22) PCT Filed: Dec. 9, 2004

(86) PCT No.: PCT/IB2004/052721

§ 371 (c)(1),
(2), (4) Date: Jun. 22, 2006

(87) PCT Pub. No.: WO2005/064678

PCT Pub. Date: Jul. 14, 2005

(65) Prior Publication Data

US 2007/0111352 A1 May 17, 2007

(30) Foreign Application Priority Data

Dec. 23, 2003 (EP) .................................. 03104953

(51) Int. Cl.
*H01L 23/544* (2006.01)
(52) U.S. Cl. .............................. 257/620; 257/E23.179; 257/48; 257/238; 257/797; 430/22; 430/5; 324/765
(58) Field of Classification Search .......... 257/E21.524, 257/E23.179, E21.599, 797, 48, 238, 68, 257/620; 430/22, 5, 311; 324/633, 765, 324/754; 356/399; 438/33
See application file for complete search history.

(56) References Cited

U.S. PATENT DOCUMENTS

| | | | | |
|---|---|---|---|---|
| 5,129,974 | A  * | 7/1992 | Aurenius | 156/64 |
| 6,114,072 | A | 9/2000 | Narimatsu et al. | |
| 6,503,765 | B1 * | 1/2003 | Chao et al. | 438/14 |
| 6,699,627 | B2 * | 3/2004 | Smith et al. | 430/22 |
| 6,727,723 | B2 * | 4/2004 | Shimizu et al. | 324/765 |
| 6,930,499 | B2 * | 8/2005 | Van Arendonk et al. | 324/763 |
| 6,967,348 | B2 * | 11/2005 | Cowles et al. | 257/48 |
| 7,102,363 | B2 * | 9/2006 | Talanov et al. | 324/639 |
| 2003/0211700 | A1 | 11/2003 | Leung et al. | |

* cited by examiner

Primary Examiner—Chris C. Chu

(57) ABSTRACT

In a wafer (1) with a number of exposure fields (2), each of which exposure fields (2) comprises a number of lattice fields (3) with an IC (4) located therein, two groups (5, 7) of dicing paths (6, 8) are provided and two control module fields (A1, A2, B1, B2, C1, D1, D2, E1, E2, F1) are assigned to each exposure field (2), each of which control module fields extends parallel to a first direction (X) and contains at least one optical control module (OCM-A1, OCM-A2, OCM-BI, OCM-B2, OCM-C1, OCM-D1, OCM-D2, OCM-E1, OCME2, OCM-F1), wherein a first control module field (OCM-A1, OCM-B1, OCM-C1, OCMD1, OCM-E1, OCM-F1) of each exposure field (2) is located between a first edge (R1, S1, T1, U1, V1, Z1) and a row of lattice fields (3) of the exposure field (2) in question and a second control module field (OCM-A2, OCM-B2, OCM-D2, OCM-E2) is located between two rows of lattice fields (3) of the exposure field (2) in question, which are arranged adjacent to a second edge (R2, S1, U2, V2), and wherein both the first control module fields (OCM-A1, OCM-B1, OCM-C1, OCM-D1, OCM-E1, OCM-F1) and the second control module fields (OCM-A2, OCM-B2, OCM-D2, OCM-E2) each lie in a first dicing path (6).

2 Claims, 2 Drawing Sheets

WAFER WITH OPTICAL CONTROL MODULES IN DICING PATHS

The invention relates to a wafer, which wafer comprises a number of exposure fields and which wafer comprises a number of intersecting, lattice-like dicing path sections and a number of lattice grids in each exposure field, wherein each lattice field contains an IC, and which wafer comprises a first group of first dicing paths and a second group of second dicing paths, wherein all of the first dicing paths of the first group run parallel to a first direction and have a first path width and wherein all of the second dicing paths of the second group run parallel to a second direction intersecting the first direction and have a second path width, and wherein the first dicing paths consist of a plurality of first dicing path sections arranged consecutive to one another in the first direction and the second dicing paths consist of a plurality of second dicing path sections arranged consecutive to one another in the second direction, and wherein the first dicing paths and the second dicing paths are provided and designed for a subsequent segregation of the lattice fields and the ICs contained therein, and wherein each exposure field has a first edge extending parallel to the first direction and a second edge extending parallel to the first direction and lying opposite the first edge, and wherein at least two control module fields are assigned to each exposure field, each of which control module fields contains at least one optical control module.

Such a wafer according to the design described in the first paragraph is known, for instance, from patent specification U.S. Pat. No. 6,114,072 A, wherein the design described with reference to FIG. 21 deserves particular attention. The known wafer is so designed that a first control module field of each exposure field immediately adjoins a first edge of the exposure field in question and that a second control module field of each exposure field immediately adjoins the second edge of the exposure field in question. Each control module field lies in a half of a first dicing path. As a result of this design, a first control module field and a second control module field of the two exposure fields in question lie between two rows of lattice fields of two exposure fields, which are arranged immediately adjacent to one another in the second direction, so that the distance extending in the second direction between two rows of lattice fields of two exposure fields, which are arranged immediately adjacent to one another in the second direction, is determined by the double value of the width of a control module field. Owing to the fact that two such first control module fields lie between two rows of lattice fields of two exposure fields, which are arranged immediately adjacent to one another in the second direction, and of the fact that each control module field lies in a half of a first dicing path and two adjacent control module fields, therefore determine the width of a whole first dicing path and that all parallel dicing paths of a wafer, including the first dicing paths between the lattice fields within each exposure field, which run parallel to the first direction, must be of equal width if the stepper steps required in the production of the wafer and the production of the ICs are to be completed precisely in the testing, dicing and assembly phases, the first dicing paths running between the ICs of each exposure field also have to have the double width of the control module fields. As a result, a not insignificant proportion of the wafer surface is required for the totality of all dicing paths, which constitutes undesirable waste.

It is an object of the invention to eliminate the facts described above and to create an improved wafer.

To achieve this object, features according to the invention are provided in a wafer according to the invention, so that a wafer according to the invention can be characterized in the following way:

Wafer, which wafer comprises a number of exposure fields and which wafer comprises a number of intersecting, lattice-like dicing path sections and a number of lattice grids in each exposure field, wherein each lattice field contains an IC, and which wafer comprises a first group of first dicing paths and a second group of second dicing paths, wherein all of the first dicing paths of the first group run parallel to a first direction and have a first path width and wherein all of the second dicing paths of the second group run parallel to a second direction intersecting the first direction and have a second path width, and wherein the first dicing paths consist of a plurality of first dicing path sections arranged consecutive to one another in the first direction and the second dicing paths consist of a plurality of second dicing path sections arranged consecutive to one another in the second direction, and wherein the first dicing paths and the second dicing paths are provided and designed for a subsequent segregation of the lattice fields and the ICs contained therein, and wherein each exposure field has a first edge extending parallel to the first direction and a second edge extending parallel to the first direction and lying opposite the first edge, and wherein at least two control module fields are assigned to each exposure field, each of which control module fields contains at least one optical control module, and wherein a first control module field of each exposure field immediately adjoins the first edge of the exposure field in question and lies in a first dicing path section and thus in a first dicing path between the first edge and a row of lattice fields lying parallel to the first direction, and wherein a second control module field of each exposure field lies at a preset distance from the second edge between two rows of lattice fields extending parallel to the first direction and arranged adjacent to one another, and thus likewise in a first dicing path.

By the provision of the features according to the invention, it can be achieved in a simple way and without any additional costs that only one control module field, this being a first control module field, lies between two rows of lattice fields arranged immediately adjacent to one another in the second direction, which control module field lies in a first dicing path, so that the distance extending in the second direction between two rows of lattice fields of two exposure fields is determined only by the width of such a control module field. As a result, the width of the dicing paths provided between adjacent lattice fields within each exposure field is expediently likewise determined by the width of such a control module field only, i.e. by the single width of a first dicing path, so that the surface area of a wafer according to the invention can be utilized much better than that of a wafer according to prior art. In a wafer according to prior art, the widths of the first dicing paths running between the lattice fields and of the control module fields are known to lie in the range between 90 µm and 120 µm, whereas in a wafer according to the invention—depending on the wafer manufacturing technology and the wafer process technology used—the widths of the first dicing paths and of the control module fields are or can be reduced to values between 80 µm and 20 µm or 15 µm or 10 µm respectively, wherein particularly thin dicing blades are used for widths between 80 µm and 50 µm and the very small widths are subject to the precondition that so-called laser dicers are used for the subsequent segregation of the lattice fields or ICs, wherein so-called "red lasers" or "blue lasers" are used. The technologies known among experts under the names of "stealth dicing" and "scribe & break dicing" can also be applied. It can further be mentioned that each exposure field preferably has the shape of a rectangle or a square, may, however, alternatively have the shape of a diamond or a triangle.

In a wafer according to the invention, a second control module field of each exposure field can lie in the central area of the exposure field in question. It has been found to be particularly advantageous if the second control module field of each exposure field immediately adjoins the row of lattice fields, which row of lattice fields immediately adjoins the second edge of the exposure field in question. In this way, a maximum distance is ensured between the first control module field and the second control module field, which is advantageous with regard to the highly precise execution of the process steps executable or executed while using the optical control modules.

It should finally be mentioned that the use of the measures according to the invention has been or is found to be most useful if the wafer is provided and used for the implementation of ICs with an IC surface area of approximately 2.0 to 10.0 mm×2.0 to 10.0 mm, i.e. approximately 4.0 to 100.0 mm². It is further useful if the exposure fields are approximately 21.0 mm×21.0 mm in size and if approximately 320 to 128 000 ICs (chips) are implemented on the wafer if its diameter is, for instance, 8.0 inches, amounting to a usable area of approximately 32 000 mm² for ICs. The measures according to the invention can, however, also be applied in wafers with a diameter of 4.0, 5.0, 6.0 and 12.0 inches.

These and other aspects of the invention are apparent from and will be elucidated with reference to the embodiments described hereinafter.

The invention is described further below with reference to an embodiment illustrated in the drawings, to which embodiment the invention is, however, not restricted.

Figure 1:
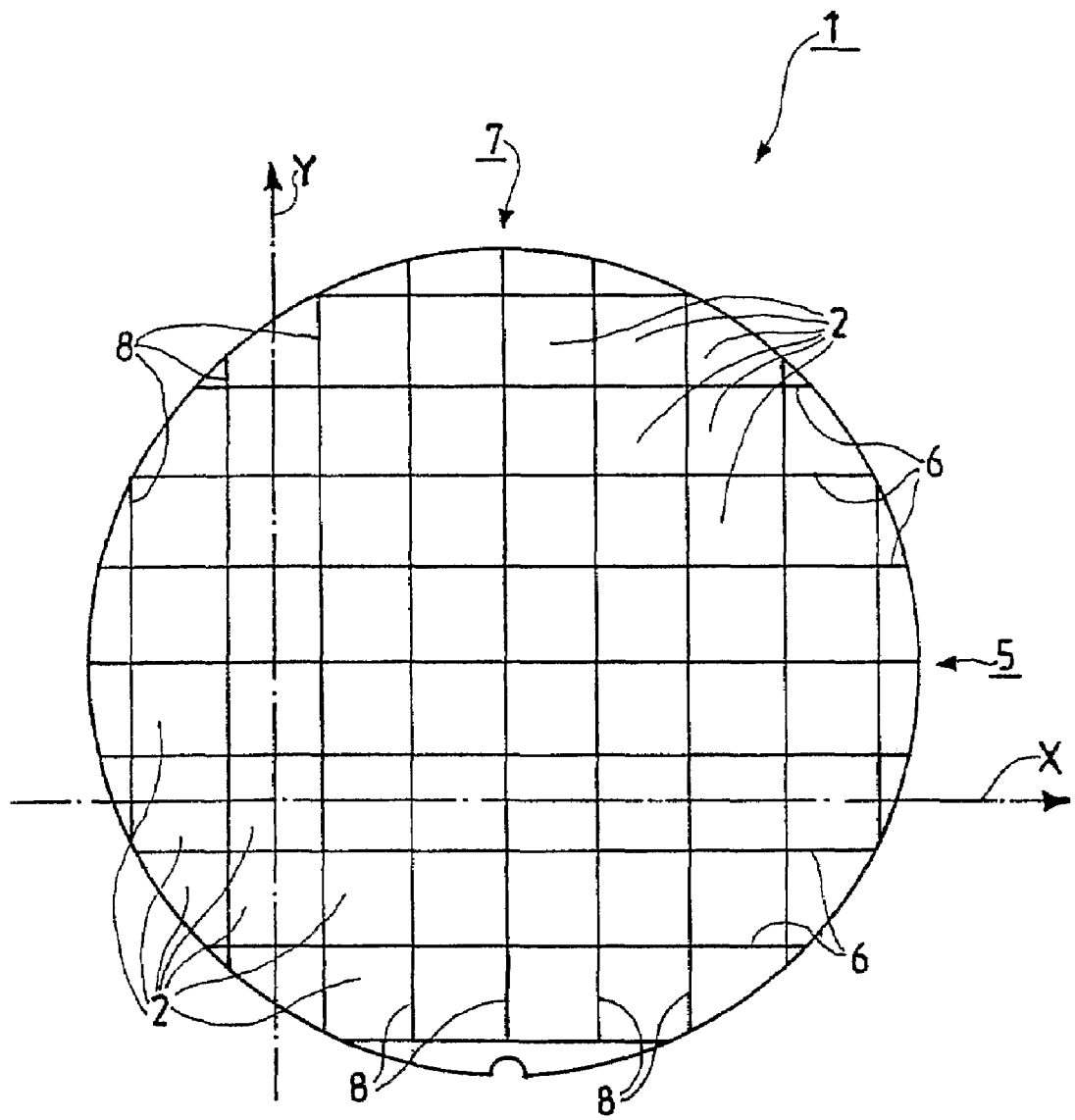
FIG. 1 is a diagrammatic top view of a wafer according to an embodiment of the invention.

FIG. 1 shows a wafer 1. The wafer 1 has semi-conductor characteristics in the known way. The wafer 1 is based on silicon. The wafer 1 can, however, alternatively be based on a polymer to obtain so-called polymer ICs with the aid of the wafer.

Figure 2:
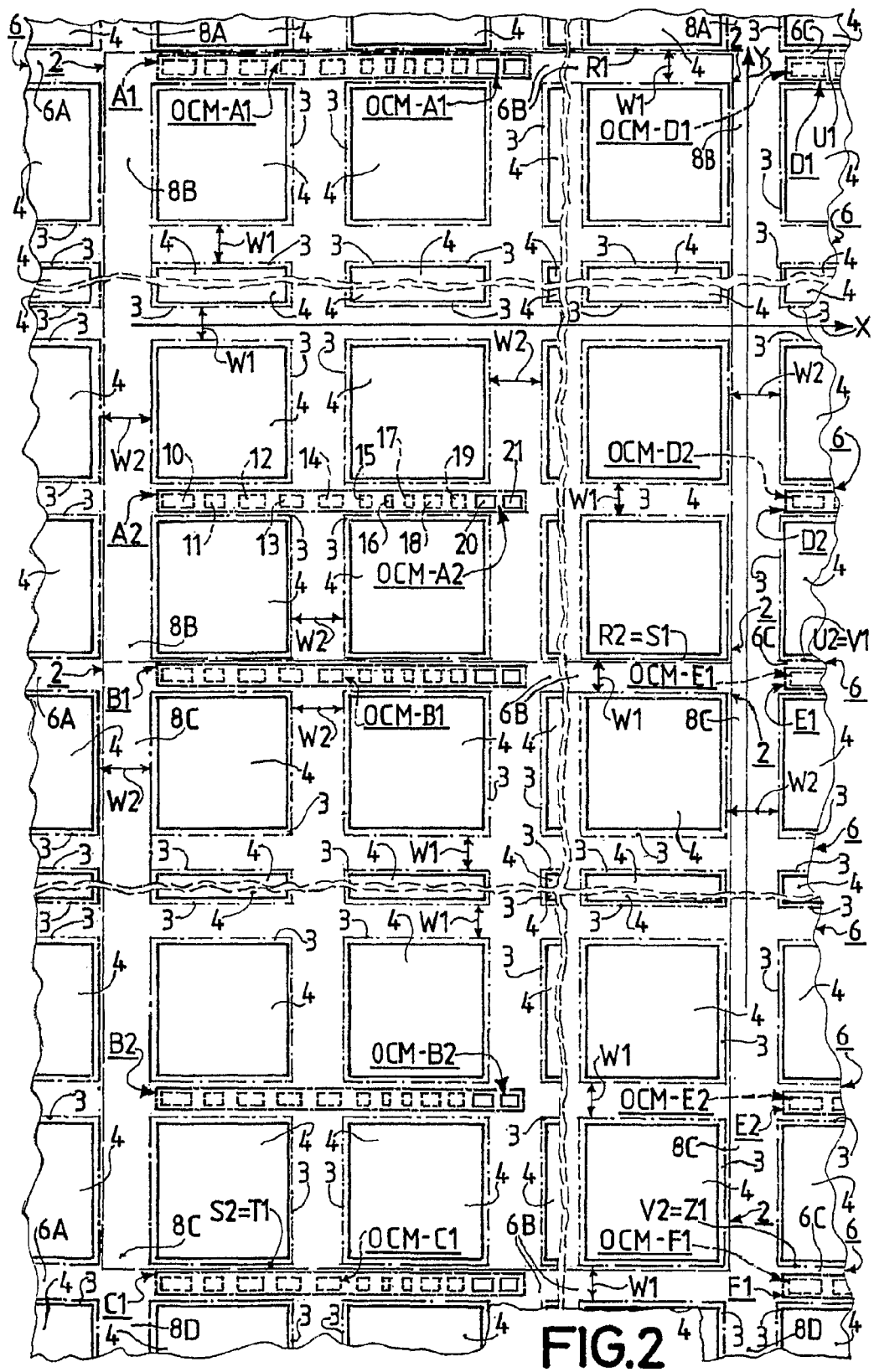
FIG. 2 is a section of the wafer according to FIG. 1, which is considerably enlarged compared to FIG. 1.

The wafer 1 comprises a number of exposure fields 2. In FIG. 1, the exposure fields 2 are shown without the components they contain. FIG. 2 only shows two complete exposure fields 2 by means of broken lines. As FIG. 2 illustrates, the wafer 1 has a number of intersecting and lattice-like dicing path sections 6A, 6B, 6C, 8A, 8B, 8C, 8D in each exposure field 2. The wafer 1 further comprises a number of lattice fields 3 between the dicing path sections 6A, 6B, 6C, 8A, 8B 8C, 8D, wherein each lattice field 3 contains one IC 4. Each IC 4 includes a plurality of IC components as has been known for a long time. The IC components are not shown in FIGS. 1 and 2. Small areas of each IC 4 do not contain any IC components.

The wafer 1 comprises a first group 5 of first dicing paths 6 and a second group 7 of second dicing paths 8. All of the first dicing paths 6 of the first group 5 run parallel to a first direction X indicated by a dot-dash line in FIG. 1. All of the second dicing paths 8 of the second group 7 run parallel to a second direction Y intersecting the first direction X and likewise indicated by a dot-dash line in FIG. 1. In the wafer 1, the first direction X and the second direction Y intersect at right angles. This is, however, not absolutely necessary, and the two directions X and Y can intersect at an angle other than 90°, for instance at an angle of 85°, 80°, 75° or 70°. All of the first dicing paths 6 have a first path width W1. All of the second dicing paths 8 have a second path width W2. In the wafer 1, the two path widths W1, W2 are different, the first path width W1 being less than the second path width W2. This is, however, not absolutely necessary, and the two path widths W1 and W2 may be equal, which is usually preferred. It is also possible to choose a first path width W1 larger than the second path width W2. The first dicing paths 6 comprise several first dicing path sections 6A, 6B, 6C arranged consecutively in the first direction X, while the second dicing paths 8 comprise several second dicing path sections 8A, 8B, 8C, 8D arranged consecutively in the second direction Y. The first dicing paths 6 and the second dicing paths 8 are provided and designed for the subsequent segregation of the lattice fields 3 and thus of the ICs contained therein.

With regard to the dicing paths, it should here be mentioned that in a wafer wherein the first dicing paths and the second dicing paths intersect at an angle other than 90°, a third group of third dicing paths can be provided, resulting in a wafer with triangular lattice fields and triangular ICs. In this case, the design can be so chosen that the dicing paths of the three groups intersect at an angle of 60°, giving the lattice fields and the ICs the planar shape of an equilateral triangle. This is, however, not necessary, because other angular relationships and thus other triangle shapes are feasible as well. The first, second and third dicing paths can have equal or different path widths.

Each exposure field 2 has a first edge R1, S1, T1, U1, V1, Z1 extending parallel to the first direction X and a second edge R2, S2, U2, V2 extending parallel to the second direction Y and lying opposite the first edge R1, S1, T1, U1, V1, Z1. The first edge of a viewed exposure field 2 and the second edge of an exposure field 2 arranged immediately adjacent to the viewed exposure field 2 in the second direction virtually coincide. The lower edge in FIG. 2, i.e. the second edge, and the right-hand edge of each exposure field in FIG. 2 coincide with lower and right-hand edges of lattice fields 3, which lattice fields 3 adjoin the lower and right-hand edges of the exposure fields 2, but for a high level of clarity these coinciding edges are shown separately in FIG. 2, using broken and dot-dash lines.

The wafer 1 comprises control module fields, each of which contains an optical control module. The provision of optical control modules on a wafer as such has been known for some time. These optical control modules contain square or rectangular interference fields detectable, depending on size, either by the naked eye or by computer-aided detection devices and used for mask adjustment and layer thickness testing. The design of the control module fields and the optical control modules contained therein in the wafer 1 according to FIG. 1 is described in detail below with reference to FIG. 2.

In the wafer 1 according to FIGS. 1 and 2, two control module fields A1, A2, B1, B2, C1, D1, D2, E1, E2, F1 are assigned to each exposure field 2. Each of the control module fields A1, A2, B1, B2, C1, D1, D2, E1, E2, F1 runs parallel to the first direction X and thus to the first dicing paths 6. Each of the control module fields A1, A2, B1, B2, C1, D1, D2, E1, E2, F1 contains an optical control module. An optical control module of this type has a known three-dimensional structure, because a control module component is implemented in each process step, with the result that at least a control module component of an optical control module which is implemented in a last process step is visible from outside of the wafer 1 or detectable by means of a computer-based detection device, whereas any control module components of a control module which have been implemented in a process step executed before the last process step are not visible or detectable from outside of the wafer. In FIG. 2, the control modules in the control module fields A1, A2, B1, B2, C1, D1, D2, E1, E2, F1 are identified by the reference numbers OCM-A1, OCM-A2, OCM-B1, OCM-B2, OCM-C1, OCM-D1, OCM-D2, OCM-E1, OCM-E2, OCM-F1. Reference numbers for the control module components are only entered for the optical control module OCM-A2 in FIG. 2. The control module components located deeper inside the wafer 1 and therefore less visible from outside of the wafer 1 and indicated by broken lines have been given the reference numbers 10, 11, 12, 13, 14, 15, 16, 17, 18 and 19. The two control module components located higher in the wafer 1 and therefore visible from outside of the wafer 1 have been given the reference numbers 20 and 21.

As FIG. 2 indicates, a first control module field A1, B1, C1, D1, E1, F1 of each exposure field 2 is located in the edge area of the exposure field 2 in question and immediately adjoins the first edge R1, S1, T1, U1, V1, Z1 of the exposure field 2 in question, and the first control module field A1, B1, C1, D1, E1, F1 of each exposure field 2 lies between the first edge R1, S1, T1, U1, V1, Z1 and a row of lattice fields 3 extending parallel to the first direction X. Each first control module field A1, B1, C1, U1, V1, Z1 lies in a first dicing path section 6A, 6B, 6C and thus in a first dicing path 6.

As FIG. 2 further indicates, a second control module field A2, B2, D2, E2 is located within the exposure field 2 in question. Each second control module field A2, B2, D2, E2 lies at a preset distance from the second edge R2, S2, U2, V2 of the exposure field 2 in question between two rows of lattice fields 3 extending parallel to the first direction X and arranged next to one another in a first dicing path section 6A, 6B, 6C and thus likewise in a first dicing path 6. The wafer 1 is so arranged that the second control module field A2, B2, E2 of each exposure field 2 immediately adjoins the row of lattice fields 3 extending parallel to the first direction X, which row of lattice fields 3 adjoins the second edge R2, S2, U2, V2, which second edge R2, S2, U2, V2 virtually coincides with the first edge R1, S1, U1, V1.

The wafer 1 offers the great advantage that each control module field A1, A2, B1, B2, C1, D1, D2, E1, E2, F1 is located in a first dicing path 6, wherein each of the dicing paths 6 provided for this purpose contains only one control module field A1, A2, B1, B2, C1, D1, D2, E1, E2, F1 and thus only one control module OCM-A1, OCM-A2, OCM-B1, OCM-B2, OCM-C1, OCM-D1, OCM-D2, OCM-E1, OCM-E2, OCM-F1, so that all of the first dicing paths 6 can be and therefore are designed narrow. In a wafer 1 according to FIGS. 1 and 2, all first dicing paths 6 have a first path width W1 of 60 µm. The first path width may alternatively be 70 µm or 50 µm or 40 µm or even less, for instance 30 µm or 20 µm or in future technologies even only 10 µm, because the first path width W1 is essentially not determined by the width of the optical control modules, but by the cutting or separation equipment with which the wafer is cut or divided to segregate the ICs.

With regard to the control modules OCM-A1, OCM-A2, OCM-B1, OCM-B2, OCM-C1, OCM-D1, OCM-D2, OCM-E1, OCM-E2, OCM-F1, it should finally be mentioned that the control modules OCM-A1, OCM-A2, OCM-B1, OCM-B2, OCM-C1, OCM-D1, OCM-D2, OCM-E1, OCM-E2, OCM-F1 preferably have the dimensions stated below, i.e. a dimension of 10.0 µm to 60.0 µm in the first direction X and a dimension of 10.0 µm to 35.0 µm in the second direction Y. Actual dimensions depend on the technology used.

In the wafer 1, the surface areas of the ICs 4 are slightly smaller than those of the lattice fields 3. The surface areas of the ICs 4 may, however, be equal to the surface areas of the lattice fields 3 if preferred.

In a wafer according to the invention, three, four, five, six or more control module fields can be provided instead of a total of two control module fields per exposure field.

It can finally be mentioned that the wafer 1 further includes so-called process control modules (PCMs) located in the second dicing paths 8 running parallel to the second direction 8. A solution as described in patent specification WO 02/069.389 A2 can, however, be provided as an alternative.

The invention claimed is:

1. A wafer which wafer comprises a number of exposure fields and which wafer comprises a number of intersecting, lattice-like dicing path sections and a number of lattice fields in each exposure field wherein each lattice field contains an IC and which wafer comprises a first group of first dicing paths and a second group of second dicing paths wherein all of the first dicing paths of the first group run parallel to a first direction and have a first path width and wherein all of the second dicing paths of the second group run parallel to a second direction intersecting the first direction and have a second path width and wherein the first dicing paths consist of a plurality of first dicing path sections arranged consecutive to one another in the first direction and the second dicing paths consist of a plurality of second dicing path sections arranged consecutive to one another in the second direction and wherein the first dicing paths and the second dicing paths are provided and designed for a subsequent segregation of the lattice fields and the ICs contained therein, and wherein each exposure field has a first edge extending parallel to the first direction and a second edge extending parallel to the first direction and lying opposite the first edge and wherein at least two control module fields are assigned to each exposure field each of which control module fields contains at least one optical control module and wherein a first control module field of each exposure field immediately adjoins the first edge of the exposure field and lies between the first edge and a row of lattice fields extending parallel to the first direction in a first dicing path section and thus in a first dicing path and wherein a second control module field of each exposure field lies at a preset distance from the second edge between two rows of lattice fields extending parallel to the first direction and arranged adjacent to one another, and thus likewise in a first dicing path.

2. A wafer as claimed in claim 1, wherein the second control module field of each exposure field immediately adjoins the row of lattice fields which row of lattice fields immediately adjoins the second edge of the exposure field.

* * * * *